(12) United States Patent
Shen

(10) Patent No.: US 7,064,550 B2
(45) Date of Patent: Jun. 20, 2006

(54) METHOD AND APPARATUS FOR FIELD DRIFT COMPENSATION OF A SUPERCONDUCTING MAGNET

(75) Inventor: Weijun Shen, Florence, SC (US)

(73) Assignee: General Electric Company, Schenectadey, NY (US)

( * ) Notice: Subject to any disclaimer, the term of this patent is extended or adjusted under 35 U.S.C. 154(b) by 0 days.

(21) Appl. No.: 10/904,550

(22) Filed: Nov. 16, 2004

(65) Prior Publication Data

US 2006/0103385 A1 May 18, 2006

(51) Int. Cl.
*G01V 3/00* (2006.01)

(52) U.S. Cl. .................................. 324/319; 324/318
(58) Field of Classification Search ................ 324/318, 324/319, 322, 309, 307, 418; 335/216, 299; 361/141
See application file for complete search history.

(56) References Cited

U.S. PATENT DOCUMENTS

| | | | | |
|---|---|---|---|---|
| 5,235,282 A | * | 8/1993 | Overweg et al. | 324/318 |
| 5,278,503 A | * | 1/1994 | Keller et al. | 324/318 |
| 5,426,366 A | * | 6/1995 | Overweg et al. | 324/319 |
| 5,731,939 A | | 3/1998 | Gross et al. | 361/19 |
| 6,097,187 A | * | 8/2000 | Srivastava et al. | 324/320 |
| 6,147,844 A | * | 11/2000 | Huang et al. | 361/19 |
| 6,456,073 B1 | * | 9/2002 | Uetake et al. | 324/309 |
| 6,680,662 B1 | * | 1/2004 | Schauwecker et al. | 335/216 |
| 6,717,781 B1 | | 4/2004 | Xu et al. | 361/19 |
| 6,727,699 B1 | * | 4/2004 | Kasten | 324/318 |
| 6,806,712 B1 | * | 10/2004 | Akgun | 324/318 |
| 6,946,936 B1 | * | 9/2005 | Schauwecker et al. | 335/216 |

FOREIGN PATENT DOCUMENTS

JP 2004361408 A * 12/2004

OTHER PUBLICATIONS

Jeong et al., "Superconducting Micro Flux Pump Using a Crytron-Like Switch;" IEEE Transactions of Applied Superconductiivity, vol. 13, No. 2, Jun. 2002, pp. 1558-1562.

* cited by examiner

*Primary Examiner*—Brij B. Shrivastav
(74) *Attorney, Agent, or Firm*—Cantor Colburn LLP

(57) ABSTRACT

A method and apparatus for magnetic field drift compensation for a superconducting magnet system includes electrically coupling a micro-flux injection system to a secondary $B_0$ superconducting coil in a secondary compensation circuit; magnetically coupling the secondary compensation circuit to the superconducting magnet via the secondary $B_0$ superconducting coil; switching the micro-flux injection system on and off either thermally or magnetically to induce a first current from a flux coil of the secondary compensation circuit into the secondary $B_0$ superconducting coil producing a secondary field to compensate magnet field drift of the superconducting magnet.

30 Claims, 3 Drawing Sheets

METHOD AND APPARATUS FOR FIELD DRIFT COMPENSATION OF A SUPERCONDUCTING MAGNET

BACKGROUND OF THE INVENTION

The present invention relates to magnetic coils for producing highly uniform magnetic fields, such as those required for magnetic resonance imaging, and particularly to a method and apparatus for compensating for magnetic field drift of a superconducting coil.

As is well known, a magnet coil wound of superconductive material can be made superconducting by placing it in an extremely cold environment. For example, a coil may be made superconducting by enclosing it in a cryostat or pressure vessel containing a cryogen. The extreme cold enables the superconducting wires to be operated in the superconducting state. In this state, the resistance of the wires is practically zero. To introduce a current flow through the coils, a power source is initially connected to the coils for a short time period. In the superconducting state, the current will continue to flow through the coils, thereby maintaining a strong magnetic field. In other words, because superconductive windings offer no resistance to electrical current flow at low temperatures, the superconducting magnet is persistent. The electric current that flows through the magnet is maintained within the magnet and does not decay noticeably with time. Superconducting magnets find wide application such as in the field of magnetic resonance imaging ("MRI"), and most of these system have the active shielded feature.

Unlike conventional magnets, an actively shielded magnet is unable to automatically compensate (i.e., via Lens's Law) for the magnetic disturbances to the $B_0$ field in the imaging volume due to external magnetic sources. This so because of the actively shielded magnet's combination of positive and negative turns. Thus, the actively shielded magnet only partly compensates for the shift in the $B_0$ field. A $B_0$ coil is a secondary coil added to an actively shielded superconducting magnet to shield the effects of moving metal objects in the vicinity of the magnet. $B_0$ coils typically have a small mutual inductance with the primary coil If the static magnetic field is significantly inhomogeneous, undesirable artifacts will occur in the image data. The uniform magnetic field is developed by a main magnetic coil and several active correction coils which are disposed on a cylindrical surface. The magnetic field produced by the coils is oriented in an axial direction with respect to the hollow cylinder on which the coils are disposed. The main magnetic coil is designed to produce as uniform a field as is practical. However, even when extraordinary steps are taken to ensure proper construction of the main coil and magnet field uniformity, some spatial field uniformity errors remain. Accordingly, it is conventional practice to employ relatively low power active correction coils to perturb the static magnetic field from the main coil in a manner which increases the overall field homogeneity.

Once the highly homogeneous magnetic field has been so established, the superconducting coils are maintained in the superconducting state for months at a time. However, all superconducting coils have a small but finite resistance and as a result, the coil currents decay slowly over time. This decay causes a drift in the static magnetic field within the cylindrical volume. The field drift due to the main coils' current decay will also induce additional currents in the magnetic coupled correction coils which produces a change in their magnetic flux contributions. The alteration of the magnetic flux produced by the additional current induced in the correction coils changes their contribution to the correction of the magnetic field from the main coil. Consequently, over a long period, the drift induced by main coils will degrade the homogeneity of the $B_0$ magnetic field within the cylinder. As a result, a service technician must periodically go through the laborious and expensive process of measuring the field throughout the cylinder and re-adjusting these electrical currents of main coils and correction coils to homogenize the $B_0$ field.

The magnetic field drift level, particular for a MRI system made with superconductivity material such as NbTi wires, will depend on the wire quality, superconducting joints, operation temperature, as well as the magnetic field level. The typical magnetic field drift rate for low temperature superconducting magnet system used for MRI purpose ranges from a few PPM (parts per million) to a few thousands PPM. As discussed above, the magnetic field is always drifting, as such, the question then becomes how much and its effect on imaging quality.

Therefore, it is desirable to further compensate for the magnetic field drift to either prolong the period between service points or to complete eliminate the current re-adjustment process.

BRIEF DESCRIPTION OF THE INVENTION

The above discussed and other drawbacks and deficiencies are overcome or alleviated by an adjustable magnetic field compensation system with micro flux adjusting capability for magnet system $B_0$ field adjustment by using a secondary low inductance superconducting coils. The method for magnetic field drift compensation for a superconducting magnet system includes electrically coupling a micro-flux injection system to a secondary $B_0$ superconducting coil in a secondary compensation circuit; magnetically coupling the secondary compensation circuit to the superconducting magnet via the secondary $B_0$ superconducting coil; switching the micro-flux injection system on and off via a trigger mechanism either thermally or magnetically to induce a first current from a flux coil of the secondary compensation circuit into the secondary $B_0$ superconducting coil producing a secondary field to compensate magnet field drift of the superconducting magnet.

In an alternative embodiment, an apparatus for magnetic field drift compensation for a superconducting magnet system is disclosed. The apparatus includes a micro-flux injection system; a secondary $B_0$ superconducting coil electrically coupled to the micro-flux injection system in a secondary compensation circuit; and a flux coil in magnetic communication with the micro-flux injection system. The secondary compensation circuit is magnetically coupled to the superconducting magnet via the secondary $B_0$ superconducting coil. The micro-flux injection switches on and off via a trigger mechanism to induce a first current from the flux coil into of the secondary compensation circuit and into the secondary $B_0$ superconducting coil to compensate magnet field drift of the superconducting magnet. The trigger mechanism switches the micro-flux injection system on and off either thermally or magnetically.

In yet another alternative embodiment, a superconducting magnet electrical circuit is disclosed. The circuit includes a superconducting coil assemblage including a main coil and a shielding coil connected in series; at least one quench resistor circuit connected in parallel with the superconducting coil assemblage; a superconductive switch coupled with the superconducting coil assemblage; a micro-flux injection system; a secondary $B_0$ superconducting coil electrically coupled to the micro-flux flux injection system in a secondary compensation circuit; and a flux coil in magnetic communication with the micro-flux flux injection system. The secondary compensation circuit is magnetically coupled to the superconducting magnet via the secondary $B_0$ superconducting coil. The micro-flux flux injection system switches on and off via a trigger mechanism to induce a first current from the flux coil into of the secondary compensation circuit and into the secondary $B_0$ superconducting coil to compensate magnet field drift of the superconducting magnet. The trigger mechanism switches the micro-flux injection system on and off either thermally or magnetically.

The above discussed and other features and advantages of the present invention will be appreciated and understood by those skilled in the art from the following detailed description and drawings.

BRIEF DESCRIPTION OF THE DRAWINGS

Referring to the exemplary drawings wherein like elements are numbered alike in the several Figures.

DETAILED DESCRIPTION OF THE INVENTION

Figure 1:
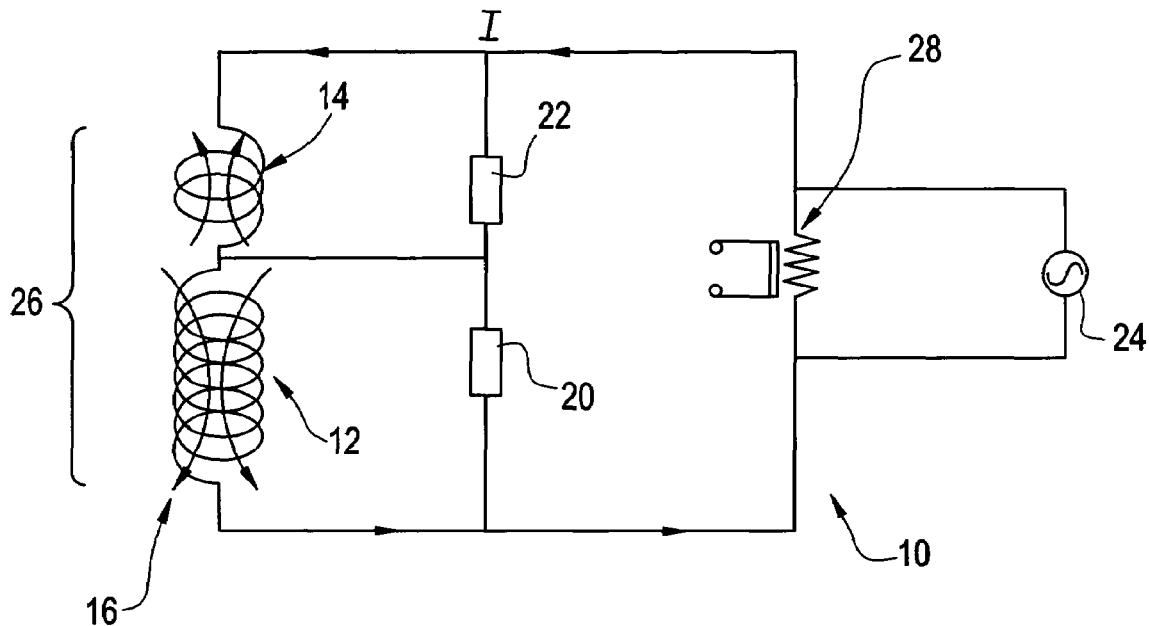
FIG. 1 is a schematic diagram of a typical electrical circuit for an active shielded superconducting magnet of a conventional MRI system.

Referring to FIG. 1, a simplified schematic circuit diagram with a quench protection circuit 10 is shown for an actively shielded MRI magnet having a main coil 12, and a bucking or shielding coil 14. Coil 12 and 14 produce a homogeneous field 16 in the image volume and bucking coil 14 also reduces fringe fields. Connected across magnet coils 12 and 14 respectively, and in parallel therewith, are quench protection resistive load and quench heaters circuits 20, 22. The circuit 10 contains a power supply (i.e. current supply) 24 for ramping up the superconductive magnet coils assembly 26 and a superconducting persistent switch 28. The superconducting switch 28 is used to transfer between a persistent superconducting operating mode and a non-persistent superconducting operating mode.

Power supply 24 is a DC power supply with removable leads, such that once a current (I) is provided to circuit 10, and the magnet system is in persistent mode, the power supply 24 may be removed from the circuit 10 and the current (I) remains flowing through the superconducting coils 26 and superconductive switch 28 producing the homogenous and stable magnetic field 16. The extreme cold reduces the resistance in the magnet coils 12, 14 to negligible levels and becoming superconductivity, such that when a power source is initially connected to the coil (for a period, for example, of ten minutes) to introduce a current flow through the coils, the current will continue to flow through the coils and its persistent switch circuit due to the negligible resistance even after power is removed, thereby maintaining a magnetic field.

Normally, the magnetic field 16 gradually reduces due to magnetic field drifting caused by several factors mentioned above. However, field drifting is primarily a result of the resistance of joints between superconducting wires making up the superconducting coils assembly 26.

Figure 2:
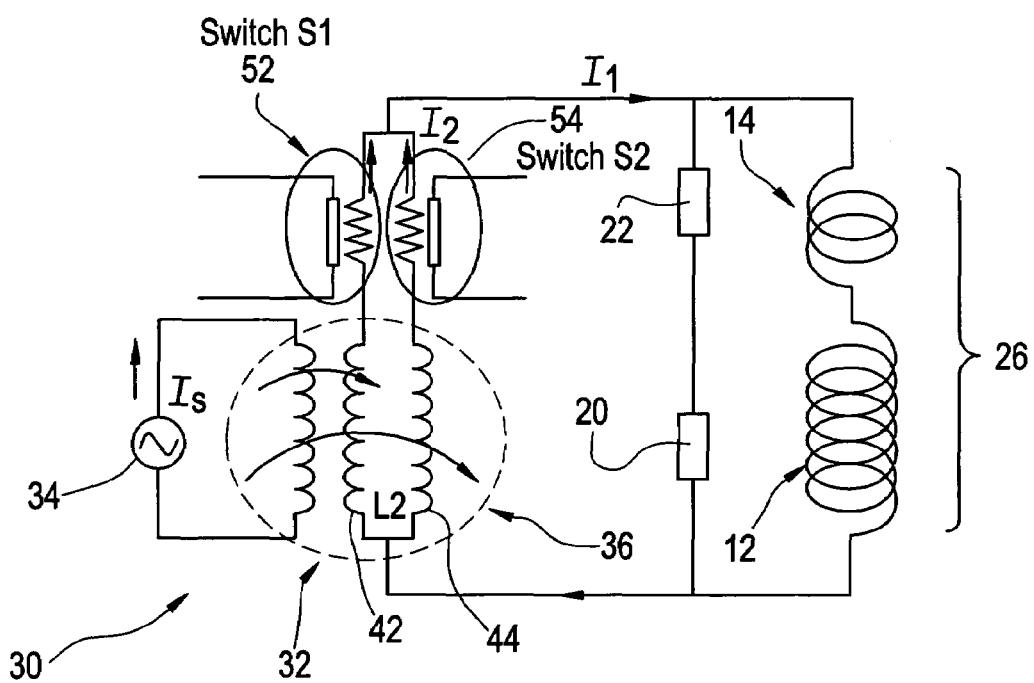
FIG. 2 is a schematic diagram of a conventional active shielded superconducting magnet system with a flux pump for energize magnet and for compensation of field loss.

FIG. 2 illustrates a conventional circuit 30 for a drift magnet 26 having a flux pump 32 configured to inject electromagnetic energy to compensate for energy loss of the drift magnet 26. Flux pump 32 includes a power supply 34 generating a current $(I_s)$ to a transformer 36. Transformer 36 includes a primary winding 42 and a secondary winding 44 connected to a first superconducting switch 52 and a second superconducting switch 54, respectively.

Switches, such as switches 52 and 54, for turning superconductive magnet circuits on and off are well known. They typically comprise a length of superconductive wire wound in non-inductive fashion and a heating element. The switch is cooled to a temperature well below the critical temperature of the superconductor (e.g., 9° Kelvin) by immersing it in a cryogen such as liquid helium. At or below the critical temperature, the resistance of the wire falls to zero, thereby making the wire superconductive. In the superconductive or persistent state, the switch is "on" because it has no resistance. The switch is turned off by turning the heating element on, which raises the temperature of the superconductive wire above the critical temperature, thereby producing a finite resistance to the flow of current.

First and second superconducting switches 52 and 54 are thermally or magnetically controlled to adjust the amount of current $(I_2)$ passing through respective switches 52 and 54 to combine and form current $(I_1)$. In this manner, flux pump 32 injects electrical energy via $(I_2)$ to compensate field loss.

Figure 3:
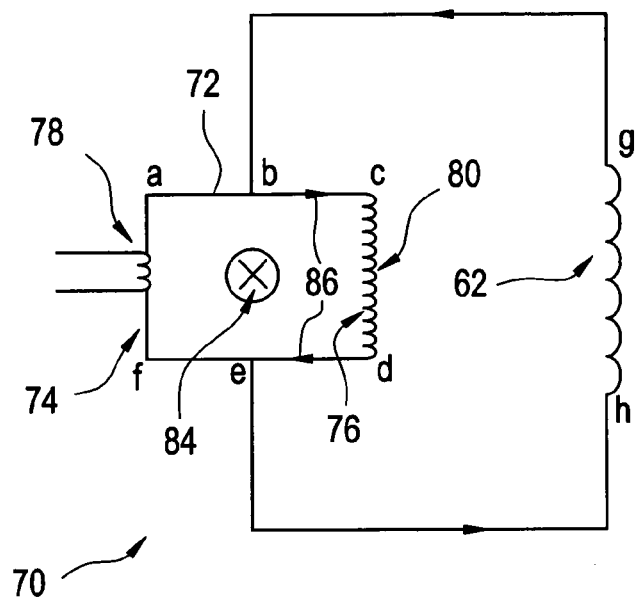
FIG. 3 is a schematic diagram of a typical magnet flux input system with a so-called cryotron type energy induction in accordance with an exemplary embodiment.

FIG. 3 shows a so-called cryotron type circuit 70 used for small current induction and energy storage. A cryotron is a switch that operates using supercoductivivty. The cryotron works on the principle of adjusting enviroment conditions to destroy the superconducting property of small wires or filaments by either raising the temperature of the wire or filament above its critical temperature or raising the magnetic field above its critical field. The cryotron may be fabricated with a piece of tantalum, for example, wrapped with a coil of niobium placed in a liquid helium bath. When the current flows through the tantalum wire it is superconducting, but when a current flows through the niobium coil, a magnetic field is produced. The magnetic field destroys the superconductivity which makes the current slow down or stop.

Still referring to FIG. 3, flux induction and energy storage circuit 70 includes a loop 72 having a first leg 74 and a second leg 76 connected to the first leg 74. Both legs 74 and 76 are electrically connected to secondary $B_0$ coil 62, as loop 72 is connected in parallel with coil 62. The first leg 74 is a weak link side to coil 62 using small current carrying capability superconducting materials (e.g., materials with a low critical field (Bc), low critical current (Ic), and low critical temperature (Tc)) such as a NbTi filament. The weak link side or first leg 74 is controlled by a trigger mechanism 78 either thermally such as a heating element 78 or magnetically by a tiny coil 78 to produce a magnetic field above the low critical field Bc of the superconducting material defining first leg 74 as a control mechanism to provide switching ON/OFF action.

In an exemplary embodiment, a magnetically control method is described below. When coil 78 produces a magnetic field above Bc of the weak link side or first leg 74, the magnetic field destroys the superconductivity of leg 74 which makes the current drop or stop due to its elecetrical resistance, and force the current to go through superconducting loop b-c-d-e-h-g-b instead of a-b-c-d-e-f-a.

The second leg 76 is a strong link having a coil 80 as an energy storage medium. The strong link side for energy storage is obtained using a thick and robust superconducting wire suitable for long-term field drift compensation. In an exemplary embodiment, the superconducting wire used for the energy storage can be a strong link, such as NbTi wires to provide a high current capability. Thus, coil 80 of second leg 76 provides for adequate current carrying capacity, and therefore provides an adequate magnetic field, for long-term field drift compensation.

The first and second legs 74 and 76, respectively, defining loop 72 surround a flux coil 84. Flux coil 84 couples with loop a-b-c-d-e-f-a and induces a current in loop a-b-c-d-e-f-a indicated generally by arrows 86 on second leg 76 indicative that a current in flux coil 84 flows into FIG. 3 generally indicated by the "X" thereof. More specifically, current in flux coil 84 induces a current in loop 72 in a direction indicated by arrows 86 and goes from a-b-c-d-e-f-a in loop 72.

When coil 78 is triggered on, the superconductivity of first leg 74 is quenched, and now, flux coil 84 induces a current in circuit 70 that travels a loop thereof designated by g-b-c-d-e-h-g. It will be recognized that loop g-b-c-d-e-h-g includes current through superconducting $B_0$ coil 62 disposed intermediate points "g" and "h". In this manner, induced current by flux coil 84 flows through secondary $B_0$ superconducting coil 62 producing a magnetic field from coil 62 proportionate to the current in coil 62. Through design, the magnetic field produced by the coil 62 can be pure $B_0$ harmonic. In addition, the variety of possible configurations for the $B_0$ coils is numerous and not limited to any particular configuration suitable to the desired end purpose.

Figure 4:
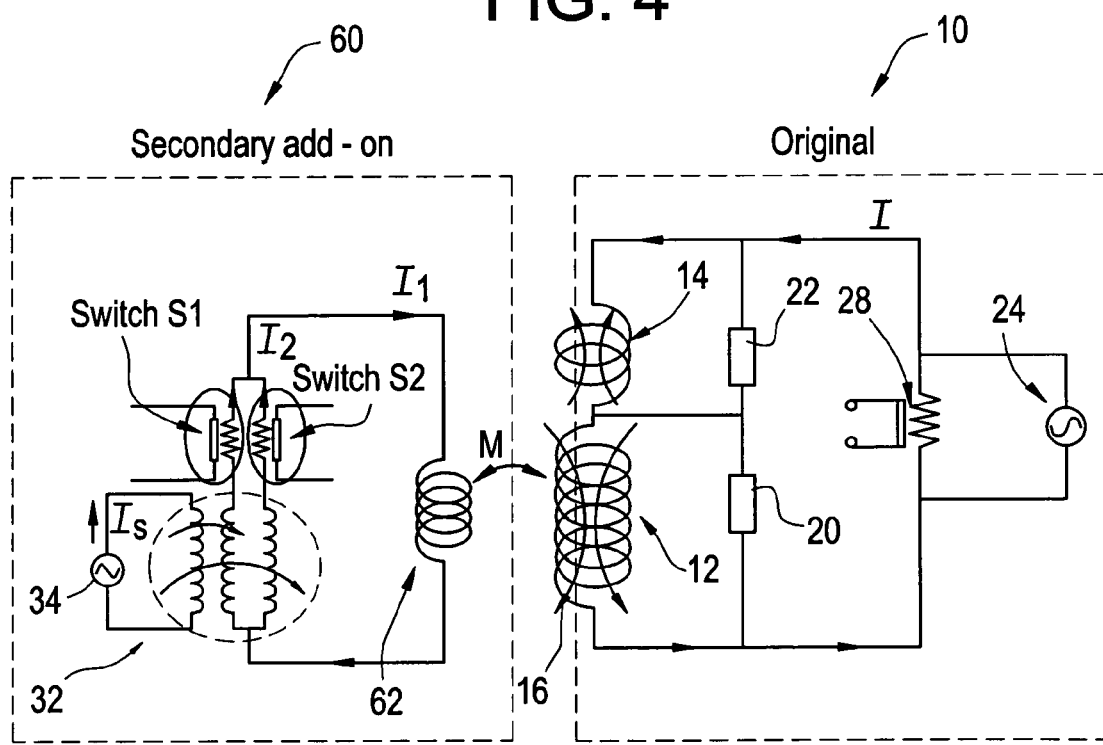
FIG. 4 is a schematic diagram of the circuit of FIG. 2 operable communicated with a secondary compensation circuit having its own $B_0$ coil, and can be used for magnetic field compensation in a superconducting MRI magnet.

FIG. 4 illustrates flux pump 32 incorporated in a secondary compensation circuit 60 operably coupled to circuit 10 of FIG. 1. The major advantage by using a secondary loop with $B_0$ function coil is the capability of maintain fine control of the magnetic flux input to the system since the inductance load for the secondary loop is small if comparing to the direct coupling method in FIG. 2. The secondary compensation circuit 60 shown in a dashed line box includes flux pump 32 electrically coupled to a secondary $B_0$ superconducting coil 62. The secondary $B_0$ superconducting coil 62 is designed in such way that the magnetic field produced by coil 62 in the imaging volume is pure $B_0$ harmonic (e.g., Helmholtz coil or its combination) when there is a current ($I_1$) passing through it. The $B_0$ coil 62 is also coupled with the main coil 12 of the original electrical circuit 10 with a pre-determined coupling factor M defined by a physical location and total number turns of coil 62 with respect to main coil 12. The total amount current ($I_2$) (energy) introduced to the secondary circuit 60 may be set by both a frequency and input flux amplitude of power supply 34.

As an example of practical use for a particular magnet with a drifting problem, the magnet field will drift and the drift rate can be measured during magnet testing, e.g., during a 24 hour main field drift test by checking a change in the magnetic field within the 24 hour time span. The frequency and input flux may then be easily characterized and adjusted for the secondary circuit 60, thus allowing the $B_0$ coil 62 to produce the needed compensation field to the original magnet circuit 10 to which it is coupled. Furthermore, electromagnetic energy may be either added to or extracted from the original circuit 10, thereby compensating for the magnetic field drift.

Figure 5:
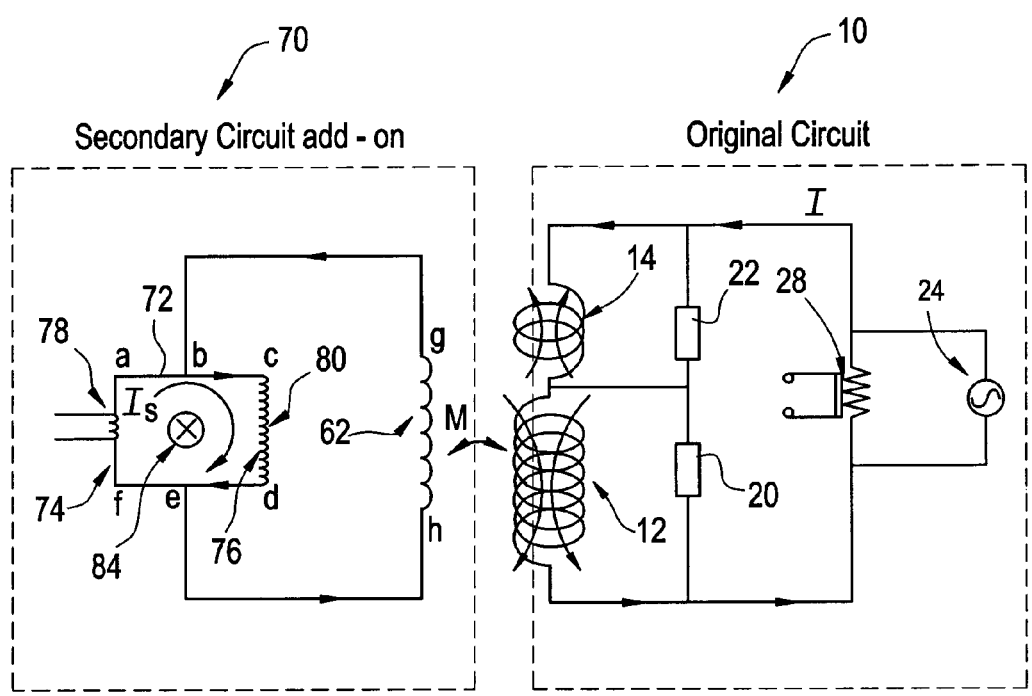
FIG. 5 is a schematic diagram of combined circuits of FIG. 4 and cryotron-type switch with micro energy induction capability for field compensation of the circuit depicted in FIG. 1 having a MRI superconducting magnet in accordance with an exemplary embodiment.

FIG. 5 illustrates another secondary compensation circuit 70 of FIG. 3 operably coupled with the original circuit 10 of FIG. 1. The $B_0$ coil 62 is coupled with the main coil 12 of the original electrical circuit 10 with a pre-determined coupling factor M determined by a physical location and total number turns of coil 62 relative to coil 12. The total amount current (energy) introduced to the secondary circuit can be set by both the frequency of applying the triggering mechanism either by thermal or magnetic method and input flux amplitude of flux coil 84.

Secondary circuit 70 coupled with circuit 10 provides a method and apparatus for magnetic field compensation for magnetic field drift of main coil 12. First, a current is induced in loop 72 defined by a-b-c-d-e-f-a with a current in flux coil 84 generally indicated by "X" and absent in coil 78 (i.e., trigger off). When a current flows in coil 78 applying the trigger, the weak link leg 74 quenches and becomes a normal conducting status from a superconducting status. The normal conducting status thus forces the induced electrical current in loop 72 (i.e., a-b-c-d-e-f-g) to go g-b-c-d-e-h-g. After a certain time (e.g., seconds or so), the trigger is turned off by terminating current flow in coil 78, thus allowing loop 72 (i.e., a-b-c-d-e-f-a) to become superconducting again with a small current $I_s$ defined by another flux induction by flux coil 84 inducing current in loop 72 (i.e., a-b-c-d-e-f-a) again. By repeating the above steps, the current in the loop defined by g-b-c-d-e-h-g will slowly and gradually increase. Since the magnetic field produced by the secondary coil 62 is proportional to the current in the coil 62, the magnetic field gradually compensates the field loss by the main coil 12. The rate of compensating the main field by the secondary field is dependent on a frequency of the trigger ON/OFF rate, as well as the flux amplitude during each cycle. In addition, the weak link leg 74 of the secondary circuit 70 automatically limits the maximum induced current each cycle, which makes it possible to induce very small amounts of flux (e.g., micro-level flux) to the main coil 12 for magnetic field drift compensation thereof. In particular, the induced flux rate can be adjusted and limited by the trigger level as well as the flux induction rate and its frequency.

It will be recognized by one skilled in the pertinent art that secondary circuit 70 provides bipolar field compensation since flux coil 84 can induce electrical current in either direction, thus making it possible to alter a magnetic field produced by the secondary $B_0$ superconducting coil 62 if needed. More specifically with reference to FIG. 5, it will be noted that changing a direction of current in flux coil 84 will extract magnetic flux from circuit 10 instead of adding magnetic flux to compensate for field loss. In this manner, secondary circuit 70 is bipolar in its ability to add and extract magnetic flux dependent on a direction of current in flux coil 84.

The above described secondary compensation circuit 70 provides a precise field compensation control level because the induced energy level can be controlled by both flux injecting level and its frequency. Furthermore, since the flux input is through a secondary, low inductance $B_0$ Coil, the increase in the $B_0$ field can be very small to meet the required compensation level. As such, secondary circuit 70 is applicable to a variety of superconducting magnet systems including MRI, NMR, ESR, ICR.

Secondary circuit 70 is stable and can provide its own independent flux loop to compensate the main coil field loss if desired and designed properly to eliminate the coupling between secondary $B_0$ coil 62 and main coils 12 and coil 14. For example, the flux injection rate for such operation can be short and have a low AC loss when compared to conventional flux pump compensation schemes, since the secondary loop can be independent or be a weak link between main coils and secondary coil o have low inductance.

Because the magnetic field produced by magnet assembly 26 is greatly influenced by, among other things, the accuracy used in manufacturing the MRI magnet and the environment in which the MRI magnet is placed, correction of the inhomogeneities in the magnetic field is usually performed for each individual MRI magnet assembly after it has been installed in the environment in which it is to be used (e.g., a hospital or laboratory). This correction can be accomplished using any known method to determine the appropriate $B_0$ coil configuration(s) needed to ensure a uniform $B_0$ magnetic field. The above method and apparatus further allows for a uniform $B_0$ magnetic field after such installation and correction compensating for magnetic field drift primarily caused by the resistance in the joints between coils.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for magnetic field drift compensation for a superconducting magnet system, the method comprising:
   electrically coupling a micro-flux injection system to a secondary $B_0$ superconducting coil in a secondary compensation circuit;
   magnetically coupling the secondary compensation circuit to the superconducting magnet via the secondary $B_0$ superconducting coil;
   switching the micro-flux injection system on and off to induce a first current from a flux coil of the secondary compensation circuit into the secondary $B_0$ superconducting coil producing a secondary field to compensate magnet field drift of the superconducting magnet, wherein the switching the micro-flux injection system on and off is either done one of thermally and magnetically;
   wherein the micro-flux system includes:
   a superconducting circuit loop having first and second legs connected in parallel to the secondary $B_0$ superconducting coil, the first and second legs defining the circuit loon and having the flux coil extending through the circuit loop, the first current in the flux coil inducing a second current in the circuit loop; and
   a trigger mechanism in communication with the first leg of the circuit loop, the trigger configured to quench the first leg and force the second current induced from the first current of the flux coil to the secondary $B_0$ superconducting coil via the second leg producing a secondary magnetic field proportionate to the second current;
   wherein a rate of field compensation by the secondary field is responsive to a frequency of an ON/OFF rate of the trigger.

2. The method of claim 1, wherein:
   the flux coil extends through the circuit loop and is substantially transverse thereto.

3. The method of claim 2, wherein the first leg has a lower superconducting capability than the second leg, the second leg including an energy storage coil.

4. The method of claim 3, wherein the first leg includes one of a NbTi filament, the second leg being configured with a superconducting NbTi wire suitable for long-term drift compensation.

5. The method of claim 4, wherein the magnetic trigger mechanism includes at least one of a coil around the first leg and a heating element, the coil being a non-superconducting wire.

6. The method of claim 5, wherein the second current flows through the first leg, the first leg is superconducting, but when a third current flows through the coil a magnetic field is produced destroying the the superconductivity of the first leg forcing the second current to the secondary $B_0$ superconducting coil via the second leg.

7. The method of claim 6, wherein a rate of field compensation by the secondary field depends on a frequency of an ON/OFF rate of the coil as well as at least one of a flux amplitude and frequency of the first current during each cycle.

8. The method of claim 7, wherein secondary $B_0$ superconducting coil provides bipolar field compensation by varying flow of the first current in the flux coil.

9. The method of claim 8, wherein the superconducting magnet system includes one of MRI NMR, ESR, and ICR.

10. The method of claim 2, wherein the trigger mechanism controls the superconductivity of the first leg having a material selected close to its critical status.

11. An apparatus for magnetic field drift compensation for a superconducting magnet system comprising:
    a micro-flux injection system;
    a secondary $B_0$ superconducting coil electrically coupled to the micro-flux injection system in a secondary compensation circuit; and
    a flux coil in magnetic communication with the micro-flux injection system;
    wherein the secondary compensation circuit is magnetically coupled to the superconducting magnet via the secondary $B_0$ superconducting coil, the micro-flux injection switches on and off to induce a first current from the flux coil into of the secondary compensation circuit and into the secondary $B_0$ superconducting coil to compensate magnet field drift of the superconducting magnet, the micro-flux injection switches the micro-flux injection system on and off by either one of thermally and magnetically;
    wherein the micro-flux injection system includes:
    a superconducting circuit loon having first and so legs connected in parallel to the secondary $B_0$ superconducting coil, the first and second legs defining the circuit loop and having the flux coil extending through the circuit loop, the first current in the flux coil inducing a second current in the circuit loop; and a magnetic trigger in communication with the first leg of the circuit loop, the magnetic trigger configured to quench the first leg and force the second current induced from the first current of the flux coil to the secondary $B_0$ superconducting coil via the second leg producing a secondary magnetic field proportionate to the second current;

wherein a rate of field compensation by the secondary magnetic field is responsive to a frequency of an ON/OFF rate of the trigger.

12. The apparatus of claim 11, wherein:
the flux coil extends through the circuit loop and is substantially transverse thereto.

13. The apparatus of claim 12, wherein the first leg has a lower superconducting current-carrying capability than the second leg, the second leg including an energy storage coil.

14. The apparatus of claim 13, wherein the first leg includes one of a NbTi filament, the second leg being configured with a superconducting wire suitable for long-term drift compensation.

15. The apparatus of claim 14, wherein the trigger mechanism includes at least one of a small resistive coil around the first leg and a heating element.

16. The apparatus of claim 15, wherein the second current flows through the first leg, the first leg is superconducting, but when a third current flows through the coil a magnetic field is produced destroying the superconductivity of the first leg forcing the second current to the secondary $B_0$ superconducting coil via the second leg.

17. The apparatus of claim 16, wherein a rate of field compensation by the secondary field depends on a frequency of an ON/OFF rate of the coil as well as at least one of a flux amplitude and frequency of the first current during each cycle.

18. The apparatus of claim 17, wherein secondary $B_0$ superconducting coil provides bipolar field compensation by varying flow of the first current in the flux coil.

19. The apparatus of claim 18, wherein the superconducting magnet system includes one of MRI, NMR, ESR, and ICR.

20. The apparatus of claim 12, wherein the trigger mechanism magnetically controls the superconductivity of the first leg having a material selected close to its critical status.

21. A superconducting magnet electrical circuit comprising:
a superconducting coil assemblage including a main coil and a shielding coil connected in series;
at least one quench resistor circuit connected in parallel with the superconducting coil assemblage;
a superconductive switch coupled with the superconducting coil assemblage;
a micro-flux injection system;
a secondary $B_0$ superconducting coil electrically coupled to the micro-flux flux injection system in a secondary compensation circuit; and
a flux coil in magnetic communication with the micro-flux flux injection system;
wherein the secondary compensation circuit is magnetically coupled to the superconducting magnet via the secondary $B_0$ superconducting coil, the micro-flux injection system switches on and off to induce a first current from the flux coil into of the secondary compensation circuit and into the secondary $B_0$ superconducting coil to compensate magnet field drift of the superconducting magnet, the micro-flux injection system switches the micro-flux injection system on and off by either one of thermally and magnetically;

wherein the micro-flux flux injection system includes:
a superconducting circuit loop having first and second legs connected in parallel to the secondary $B_0$ superconducting coil, the first and second legs defining the circuit loop and having the flux coil extending through the circuit loop, the first current in the flux coil inducing a second current in the circuit loop; and a trigger mechanism in communication with the first leg of the circuit loop, the trigger configured to quench the first leg and force the second current induced from the first current of the flux coil to the secondary $B_0$ superconducting coil via the second leg producing a secondary magnetic field proportionate to the second current;

wherein a rate of field compensation by the secondary field is responsive to a frequency of an ON/OFF rate of the trigger.

22. The circuit of claim 21, wherein:
the flux coil extends through the circuit loop and is substantially transverse thereto.

23. The circuit of claim 22, wherein the first leg has a lower superconducting capability than the second leg, the second leg including an energy storage coil.

24. The circuit of claim 23, wherein the first leg includes one of a NbTi filament the second leg being configured with a superconducting wire suitable for long-term drift compensation.

25. The circuit of claim 24, wherein the magnetic trigger mechanism includes at least one of a resistive coil around the first leg and a heating element.

26. The circuit of claim 25, wherein the second current flows through the first leg, the first leg is superconducting, but when a third current flows through the coil a magnetic field is produced destroying the the superconductivity of the first leg forcing the second current to the secondary $B_0$ superconducting coil via the second leg.

27. The circuit of claim 26, wherein a rate of field compensation by the secondary field depends on a frequency of an ON/OFF rate of the coil as well as at least one of a flux amplitude and frequency of the first current during each cycle.

28. The circuit of claim 27, wherein secondary $B_0$ superconducting coil provides bipolar field compensation by varying flow of the first current in the flux coil.

29. The circuit of claim 28, wherein the superconducting magnet system includes one of MRI, NMR, ESR, and ICR.

30. The circuit of claim 22, wherein the trigger mechanism magnetically controls the superconductivity of the first leg having a material selected close to its critical status.

* * * * *

UNITED STATES PATENT AND TRADEMARK OFFICE
CERTIFICATE OF CORRECTION

PATENT NO. : 7,064,550 B2 Page 1 of 1
APPLICATION NO. : 10/904550
DATED : June 20, 2006
INVENTOR(S) : Weijun Shen It is certified that error appears in the above-identified patent and that said Letters Patent is hereby corrected as shown below:

Column 8,
Line 62, after "circuit", delete "loon" and insert therefor --loop--.
Line 62, after "and", delete "so" and insert therefor --second--.

Signed and Sealed this

Twenty-seventh Day of February, 2007

JON W. DUDAS
*Director of the United States Patent and Trademark Office*